(12) United States Patent
Lin et al.

(10) Patent No.: US 11,581,422 B2
(45) Date of Patent: Feb. 14, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chun-Hao Lin, Kaohsiung (TW); Hsin-Yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 132 days.

(21) Appl. No.: 17/161,707

(22) Filed: Jan. 29, 2021

(65) Prior Publication Data

US 2021/0167189 A1  Jun. 3, 2021

Related U.S. Application Data

(63) Continuation of application No. 16/396,777, filed on Apr. 29, 2019, now Pat. No. 10,943,993.

(30) Foreign Application Priority Data

Apr. 1, 2019  (CN) .......................... 201910256992.7

(51) Int. Cl.
*H01L 29/66* (2006.01)
*H01L 21/762* (2006.01)

(52) U.S. Cl.
CPC .. *H01L 29/66628* (2013.01); *H01L 21/76232* (2013.01); *H01L 29/6656* (2013.01); *H01L 29/66787* (2013.01)

(58) Field of Classification Search
CPC ............ H01L 29/66795; H01L 29/785; H01L 21/823431; H01L 21/823481
See application file for complete search history.

(56) References Cited

U.S. PATENT DOCUMENTS

| 9,524,911 | B1 | 12/2016 | Tsai |
| 9,953,880 | B1 | 4/2018 | Lin |
| 10,943,993 | B2 | 3/2021 | Lin |
| 2014/0027820 | A1 | 1/2014 | Aquilino et al. |
| 2015/0054078 | A1 | 2/2015 | Xie |
| 2017/0271503 | A1 | 9/2017 | Yu |
| 2021/0159322 | A1* | 5/2021 | Lin ................... H01L 29/66787 |

FOREIGN PATENT DOCUMENTS

EP  3 288 085 A1  2/2018

* cited by examiner

*Primary Examiner* — Mark V Prenty
(74) *Attorney, Agent, or Firm* — Winston Hsu

(57) ABSTRACT

A semiconductor device includes a gate isolation structure on a shallow trench isolation (STI), a first epitaxial layer on one side of the gate isolation structure, a second epitaxial layer on another side of the gate isolation structure, first fin-shaped structures directly under the first epitaxial layer, and second fin-shaped structures directly under the second epitaxial layer, in which the STI surrounds the first fin-shaped structures and the second fin-shaped structures.

1 Claim, 15 Drawing Sheets

US 11,581,422 B2

SEMICONDUCTOR DEVICE AND METHOD FOR FABRICATING THE SAME

CROSS REFERENCE TO RELATED APPLICATIONS

This is a continuation application of U.S. patent application Ser. No. 16/396,777, filed on Apr. 29, 2019, and all benefits of such earlier application are hereby claimed for this new continuation application.

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: forming a fin-shaped structure on a substrate, wherein the fin-shaped structure is extending along a first direction; forming a gate layer on the fin-shaped structure; removing part of the gate layer and part of the fin-shaped structure to form a first trench for dividing the fin-shaped structure into a first portion and a second portion, wherein the first trench is extending along a second direction; forming a patterned mask on the gate layer and into the first trench; removing part of the gate layer and part of the fin-shaped structure to form a second trench, wherein the second trench is extending along the first direction; and filling a dielectric layer in the first trench and the second trench.

According to another aspect of the present invention, a semiconductor device preferably includes a first gate structure and a second gate structure on a shallow trench isolation (STI), a first hard mask on the first gate structure and a second hard mask on the second gate structure, and a gate isolation structure between the first gate structure and the second gate structure, in which a top surface of the gate isolation structure is lower than a top surface of the first gate structure.

According to yet another aspect of the present invention, a semiconductor device includes a gate isolation structure on a shallow trench isolation (STI), a first epitaxial layer on one side of the gate isolation structure, and a second epitaxial layer on another side of the gate isolation structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
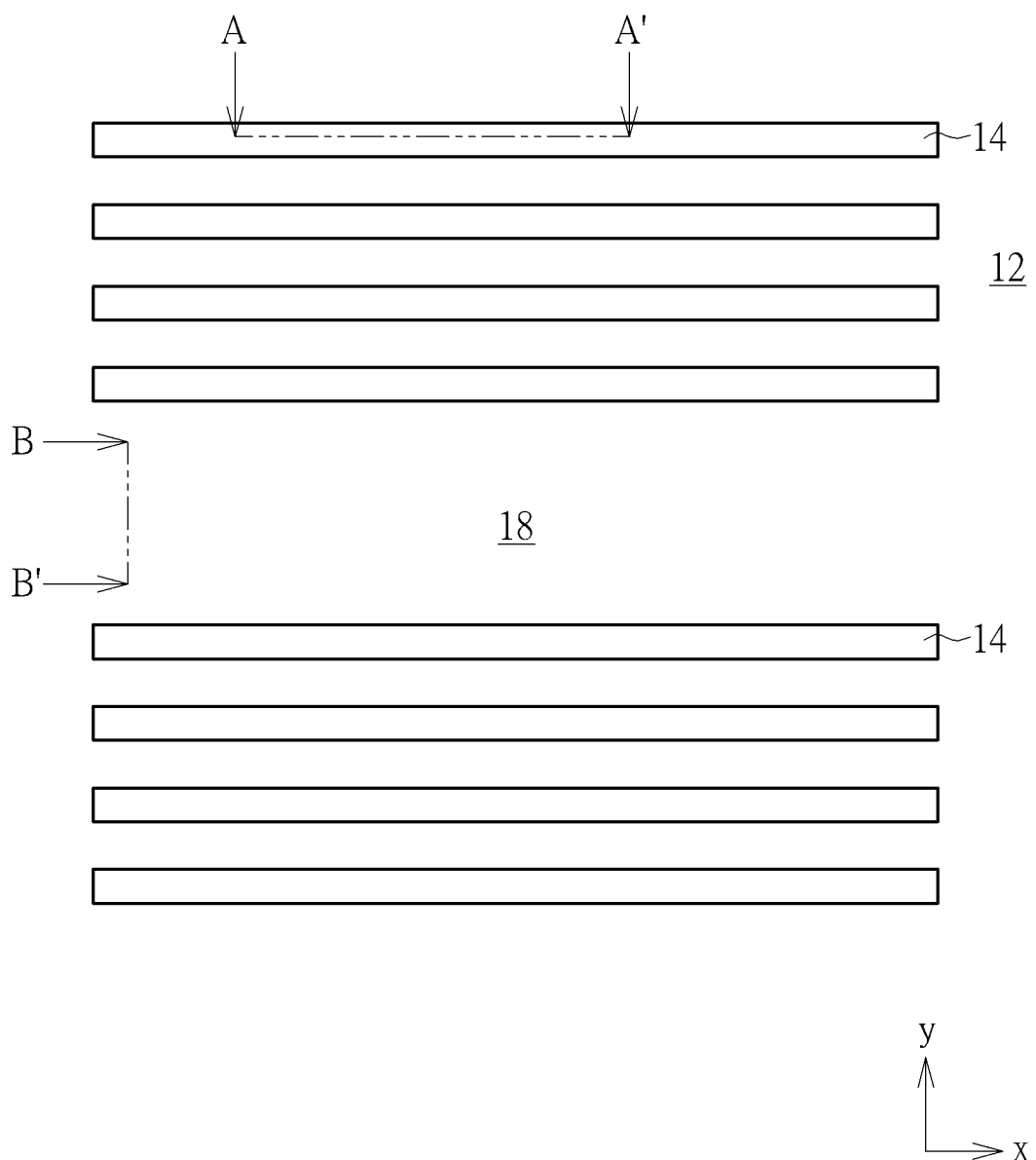
FIG. 1 is a top view illustrating a method for fabricating a semiconductor device according to an embodiment of the present invention.
Figure 2:
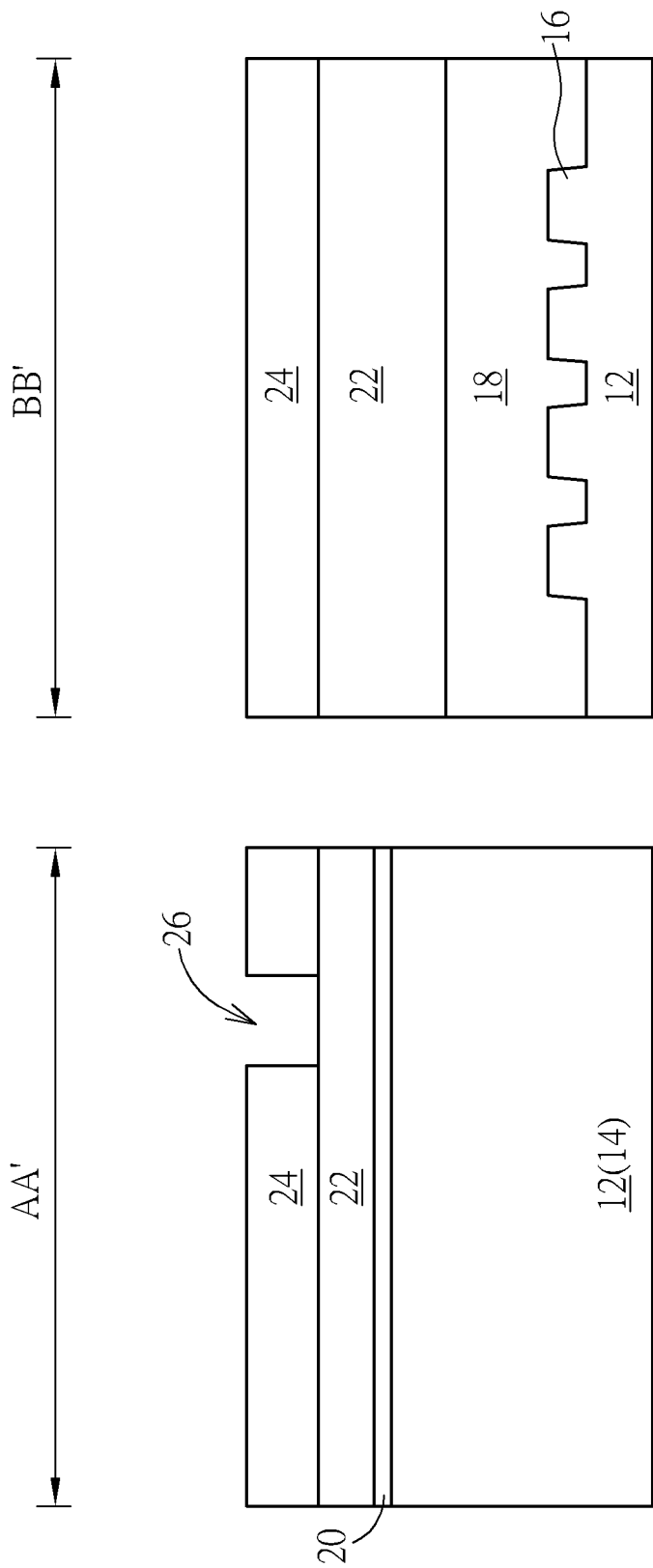
FIG. 2 illustrates cross-section views of FIG. 1 along the sectional line AA' and sectional line BB'.

Referring to FIGS. 1-2, in which FIG. 1 is a top view illustrating a method for fabricating a semiconductor device according to an embodiment of the present invention, the left portion of FIG. 2 illustrates a cross-sectional view of FIG. 1 for fabricating the semiconductor device along the sectional line AA', and the right portion of FIG. 2 illustrates a cross-sectional view of FIG. 1 for fabricating the semiconductor device along the sectional line BB'. As shown in FIGS. 1-2, a substrate 12, such as a silicon substrate or silicon-on-insulator (SOI) substrate is first provided, and a plurality of fin-shaped structures 14 extending along a first direction (such as the X-direction) are formed on the substrate 12. It should be noted that even though eight fin-shaped structures 14 are disposed on the substrate 12 in this embodiment, it would also be desirable to adjust the number of fin-shaped structures 14 depending on the demand of the product, which is also within the scope of the present invention.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained. It should be noted that the bumps 16 protruding above the surface of the substrate 12 are preferably fin-shaped structures remained on the surface of the substrate 12 after the fin cut process is completed therefore the height of the bumps 16 are substantially lower than the height of the fin-shaped structures 14 on the left portion of FIG. 2.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure are all within the scope of the present invention.

Next, a shallow trench isolation (STI) 18 is formed around the fin-shaped structures 14, such as surrounding the fin-shaped structures 14 in the left portion of FIG. 2 and disposed on top of the bumps 16 in the right portion of FIG. 2. In this embodiment, the formation of the STI 18 could be accomplished by conducting a flowable chemical vapor deposition (FCVD) process to form a silicon oxide layer on the substrate 12 and covering the fin-shaped structures 14 entirely. Next, a chemical mechanical polishing (CMP) process along with an etching process are conducted to remove part of the silicon oxide layer so that the top surface of the remaining silicon oxide is even with or slightly lower than the top surface of the fin-shaped structures 14 for forming the STI 18.

Next, a gate dielectric layer 20 and a gate layer 22 are formed to cover the fin-shaped structures 14 and the STI 18 entirely, and a patterned mask 24 is formed on the gate layer 22, in which the patterned mask 22 includes an opening 26 exposing part of the gate layer 22 surface. In this embodiment, the gate dielectric layer 20 preferably includes silicon oxide and the gate layer 22 is selected from the group consisting of amorphous silicon and polysilicon. The patterned mask 24 could additionally include an organic dielectric layer (ODL), a silicon-containing hard mask bottom anti-reflective coating (SHB), and a patterned resist and the step of forming the opening 26 in the patterned mask 24 could be accomplished by using the patterned resist as mask to remove part of the SHB and part of the ODL. It should be noted that in order to more clearly illustrate the fabrication process conducted thereafter, the gate dielectric layer 20 between the STI 18 and gate layer 22 is not shown in the cross-section view taken along the sectional line BB'.

Figure 3:
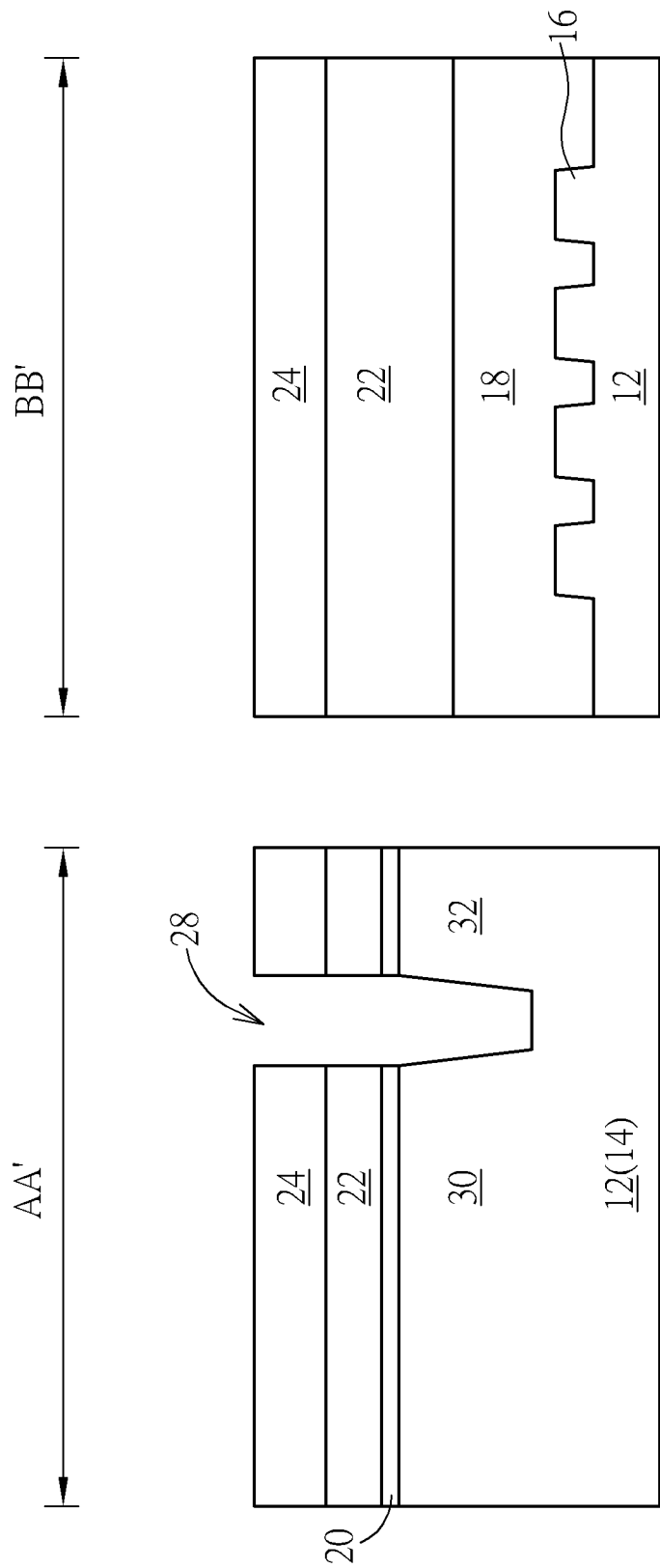
FIG. 3 illustrates a method for fabricating a semiconductor device according to an embodiment of the present invention following FIG. 2.

Next, as shown in left portion of FIG. 3, an etching process is conducted by using the patterned mask 24 as mask to remove part of the gate layer 22, part of the gate dielectric layer 20, and part of the fin-shaped structures 14 to form a first trench 28 and at the same time divide the fin-shaped structures 14 into two portions including a first portion 30 on the left side of the first trench 28 and a second portion 32 on the right side of the first trench 28, in which the first trench 28 preferably extends along a second direction (such as Y-direction) orthogonal to the first direction.

Figure 4:
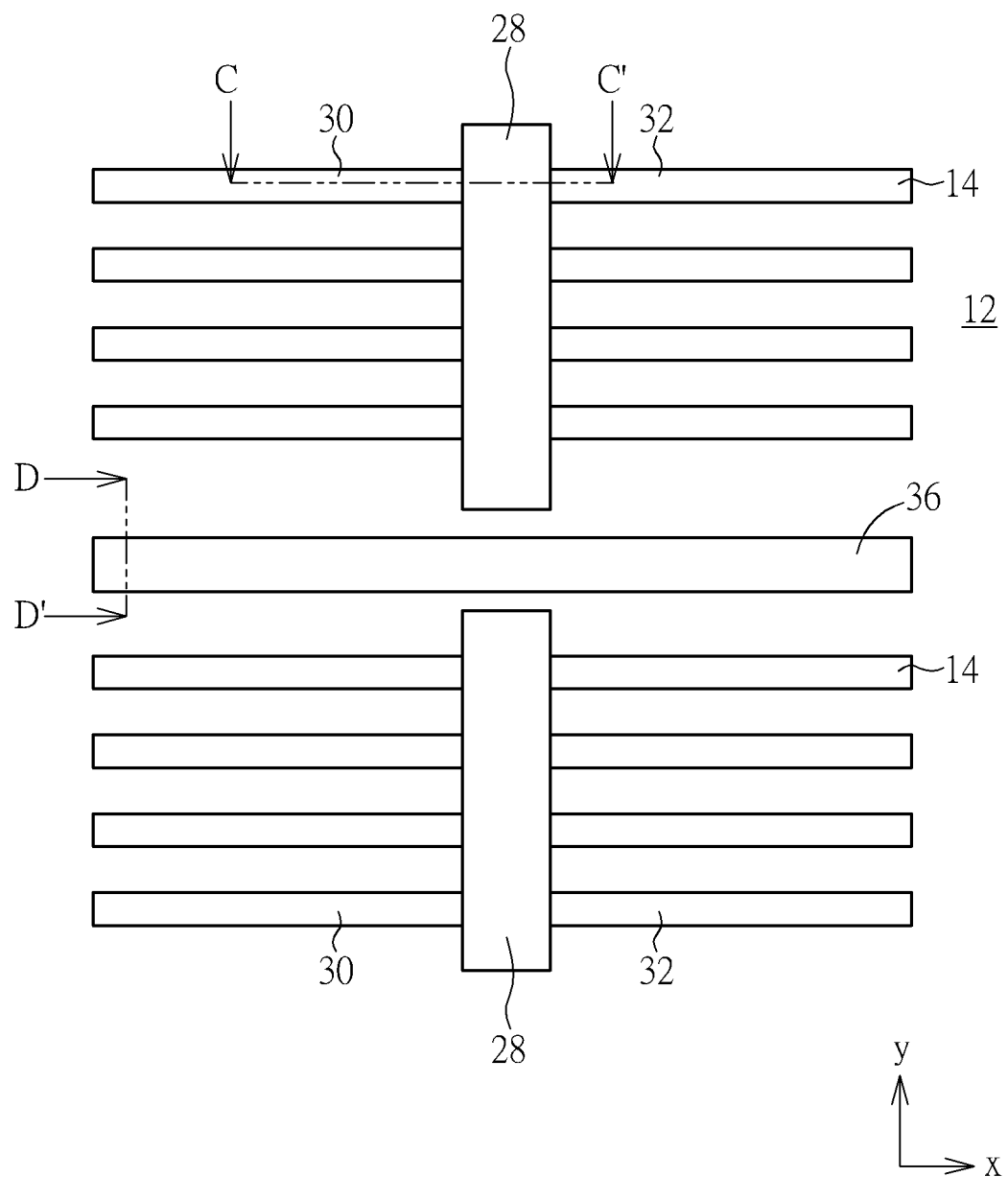
FIG. 4 is a top view illustrating a method for fabricating a semiconductor device according to an embodiment of the present invention following FIG. 1.
Figure 5:
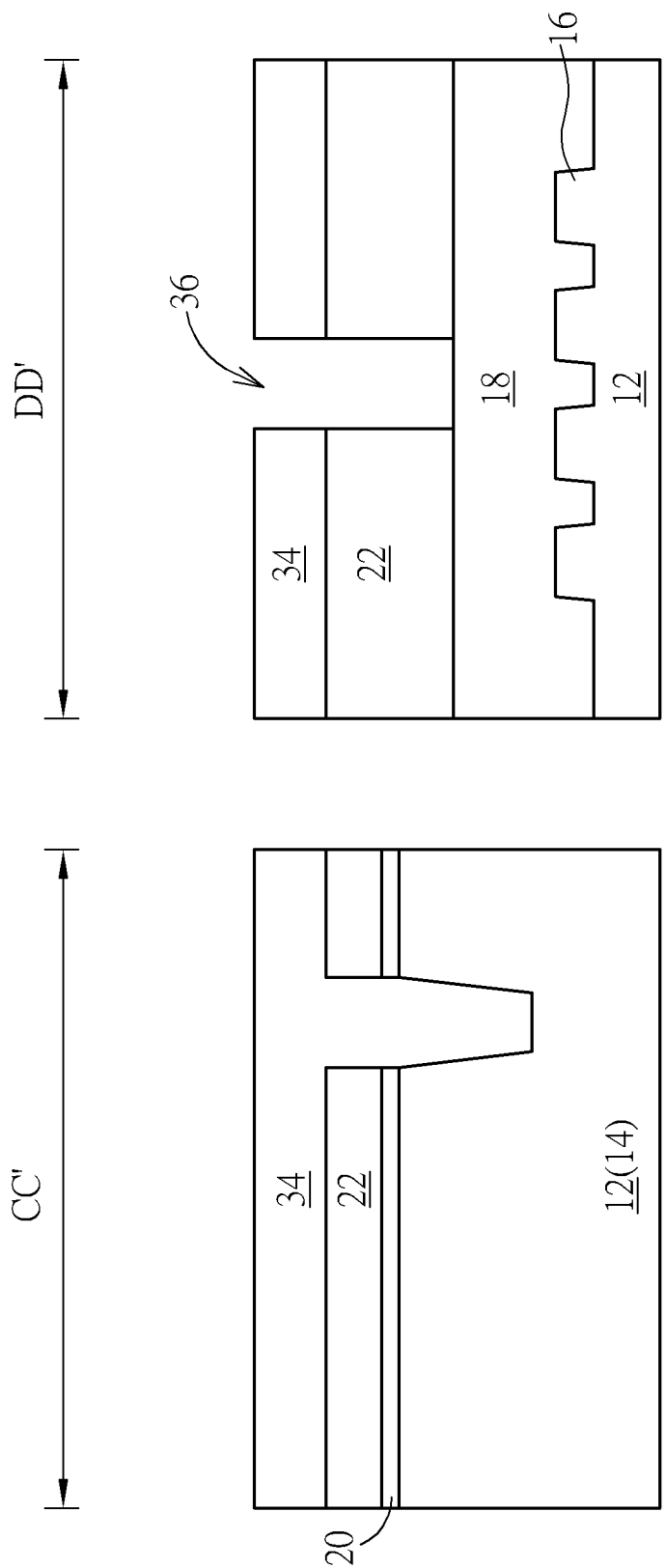
FIG. 5 illustrates cross-section views of FIG. 4 along the sectional line CC' and sectional line DD'.

Next, referring to FIGS. 4-5, in which FIG. 4 is a top view illustrating a method for fabricating a semiconductor device according to an embodiment of the present invention following FIG. 1, the left portion of FIG. 5 illustrates a cross-sectional view of FIG. 4 for fabricating the semiconductor device along the sectional line CC', and the right portion of FIG. 5 illustrates a cross-sectional view of FIG. 4 for fabricating the semiconductor device along the sectional line DD'. As shown in FIGS. 4-5, it would be desirable to first remove the patterned mask 24 completely, and then form another patterned mask 34 on the gate layer 22 to fill the first trench 28 completely, in which the patterned mask 34 preferably includes an opening extending along the first direction (such as X-direction) and exposing part of the gate layer 22 between the top four fin-shaped structures 14 and the bottom four fin-shaped structures 14. Next, the patterned mask 34 is used as a mask to remove part of the gate layer 22 and exposing the STI 18 underneath to form a second trench 36, in which the second trench 36 preferably extends along the first direction between the top four fin-shaped structures 14 and bottom four fin-shaped structures 14 as shown in FIG. 4.

Figure 6:
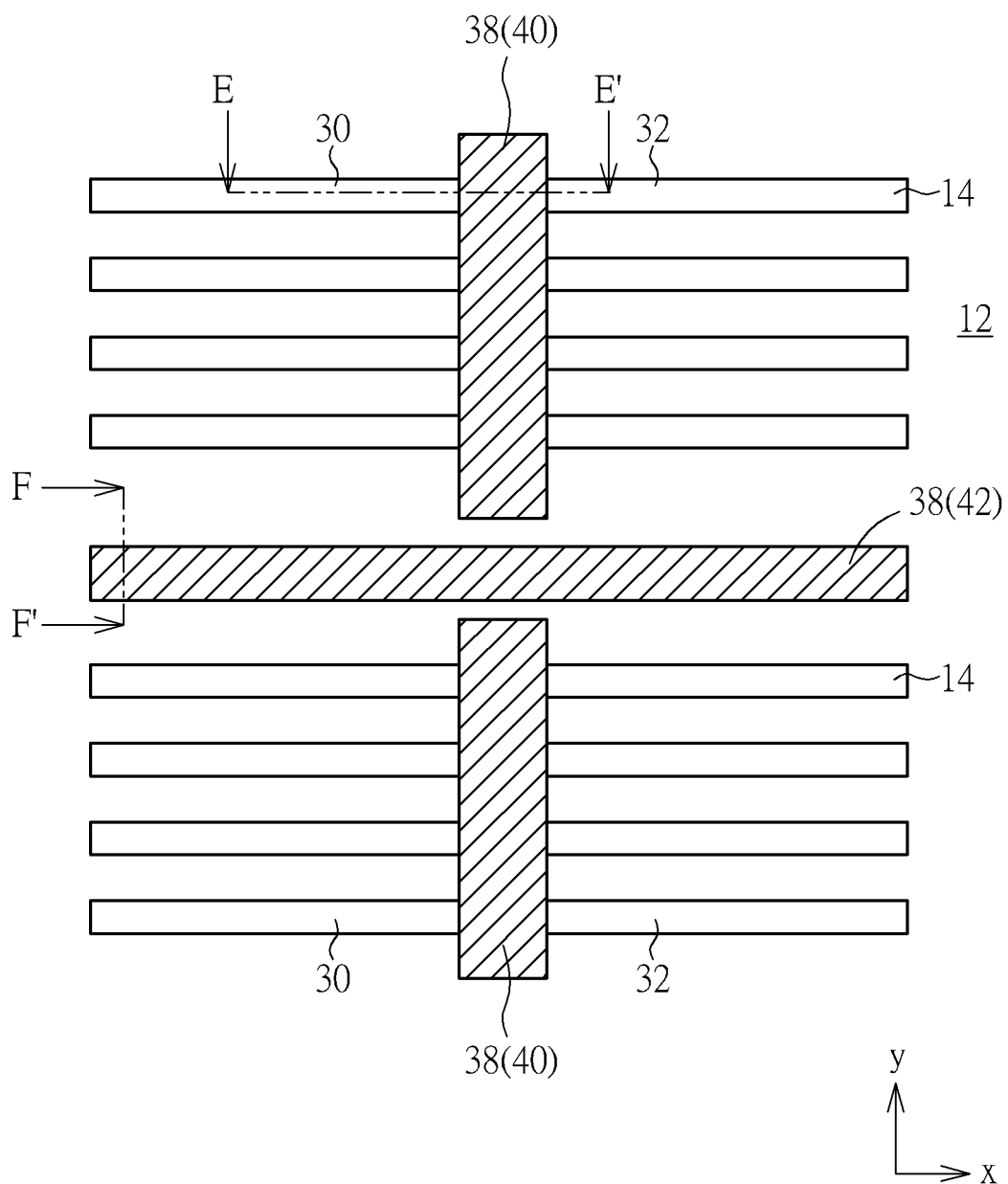
FIG. 6 is a top view illustrating a method for fabricating a semiconductor device according to an embodiment of the present invention following FIG. 4.
Figure 7:
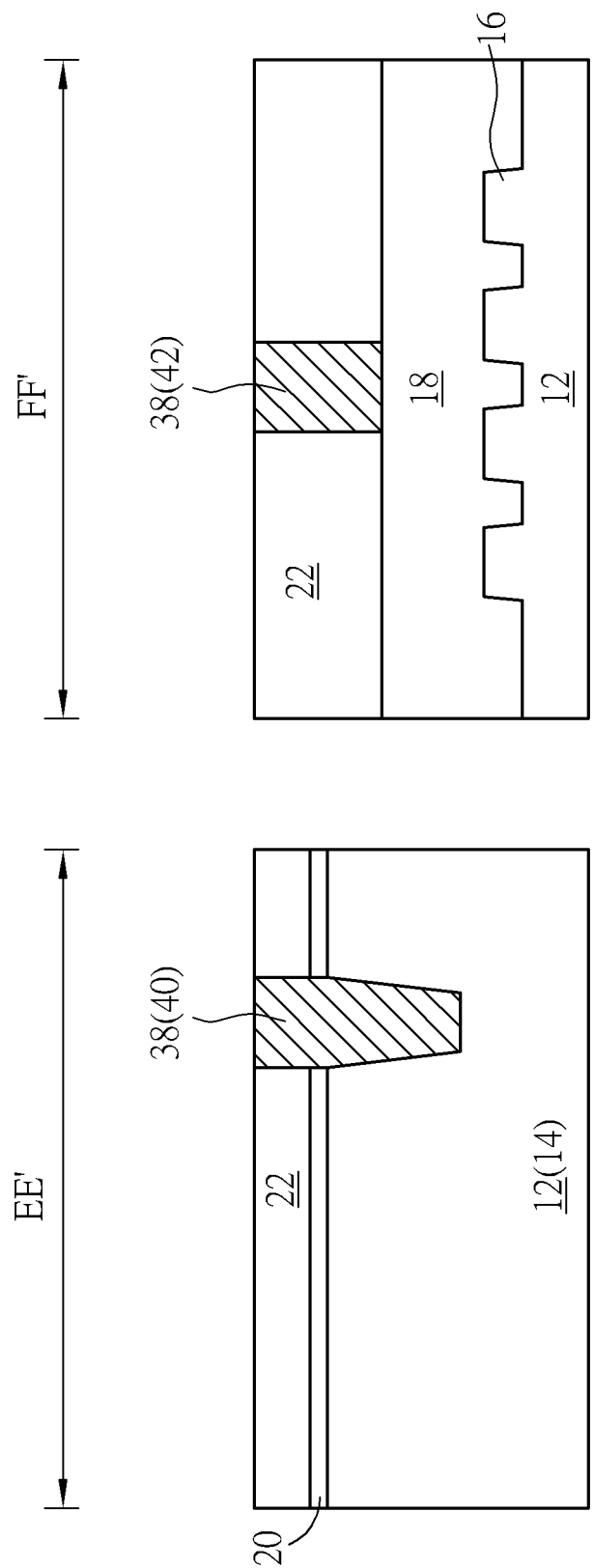
FIG. 7 illustrates cross-section views of FIG. 6 along the sectional line EE' and sectional line FF'.

Next, referring to FIGS. 6-7, in which FIG. 6 is a top view illustrating a method for fabricating a semiconductor device according to an embodiment of the present invention following FIG. 4, the left portion of FIG. 7 illustrates a cross-sectional view of FIG. 6 for fabricating the semiconductor device along the sectional line EE', and the right portion of FIG. 7 illustrates a cross-sectional view of FIG. 6 for fabricating the semiconductor device along the sectional line FF'. As shown in FIGS. 6-7, it would be desirable to first remove the patterned mask 34 completely and then forming a dielectric layer 38 to cover the gate layer 22 while filling the first trench 28 and the second trench 36. Next, a planarizing process such as chemical mechanical polishing (CMP) process is conducted to remove part of the dielectric layer 38 so that the top surface of the remaining dielectric layer 38 is even with the top surface of the gate layer 22. This forms a single diffusion break (SDB) structures 40 in the first trench 28 and a gate isolation structure 42 in the second trench 36 at the same time. In this embodiment, the SDB structure 40 and gate isolation structure 42 made of dielectric layer 38 could include same material or different material as the STI 18. For instance, the SDB structure 40 and the gate isolation structure 42 in this embodiment could include but not limited to for example silicon oxide, silicon nitride (SiN), and/or silicon oxynitride (SiON).

Figure 8:
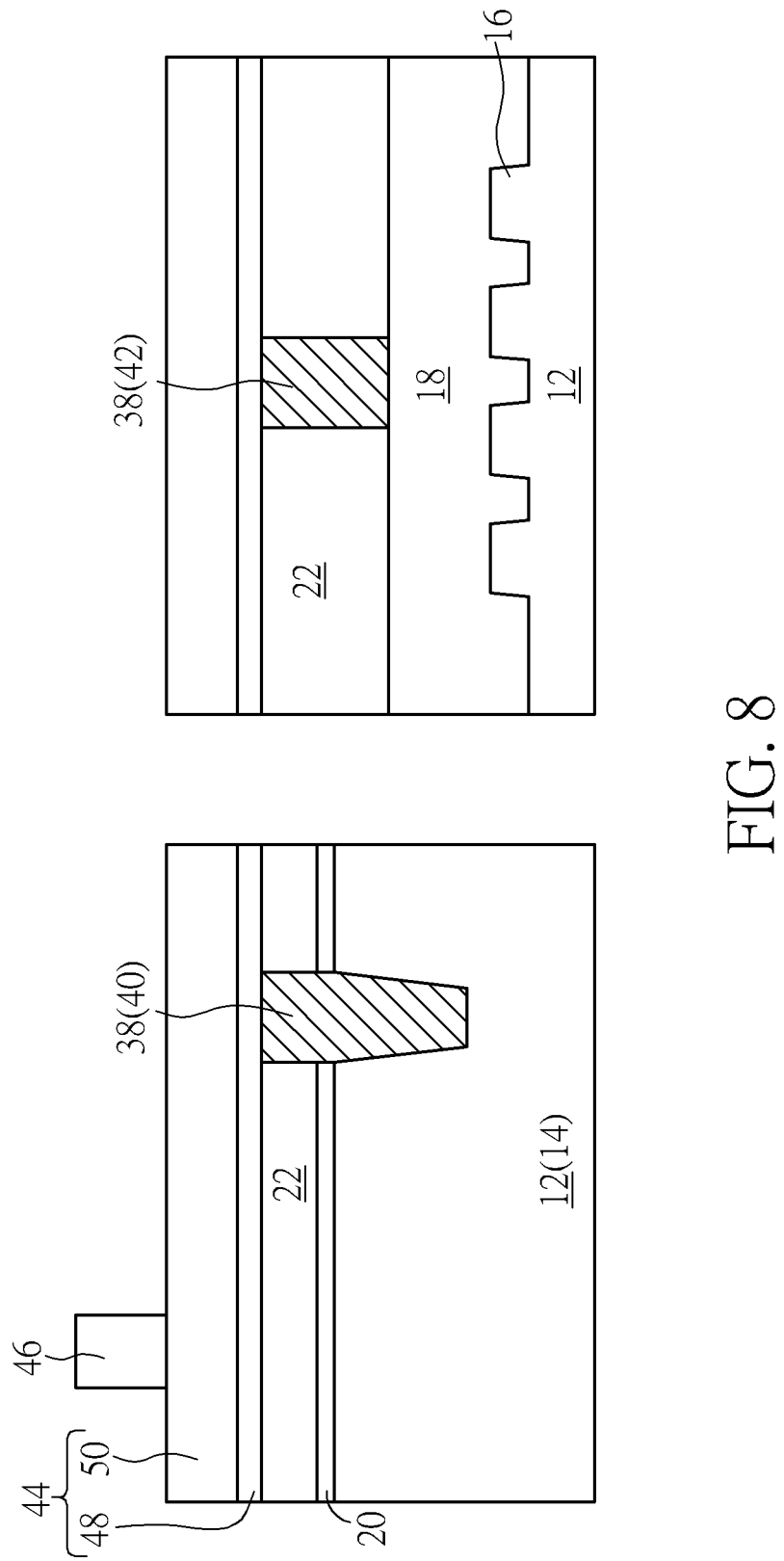
FIG. 8 illustrates a method for fabricating a semiconductor device according to an embodiment of the present invention following FIG. 7.

Next, as shown in FIG. 8, a hard mask 44 is formed on the gate layer 22, the SDB structure 40, and the gate isolation structure 42, and a patterned mask 46 is formed on the hard mask 44 while exposing part of the hard mask 44 surface. In this embodiment, the hard mask 44 preferably includes a composite structure such as a hard mask 48 and another hard mask 50, in which the hard mask 48 and the hard mask 50 are preferably made of different materials. For instance, the hard mask 48 is preferably made of SiN while the hard mask 50 is made of silicon oxide, but not limited thereto. The patterned mask 46 could include a single patterned resist or could be made of same material as the patterned mask 24 shown in FIG. 2. For instance, the patterned mask 46 could include a tri-layer structure having an organic dielectric layer (ODL), a silicon-containing hard mask bottom anti-reflective coating (SHB), and a patterned resist, which are all within the scope of the present invention.

Figure 9:
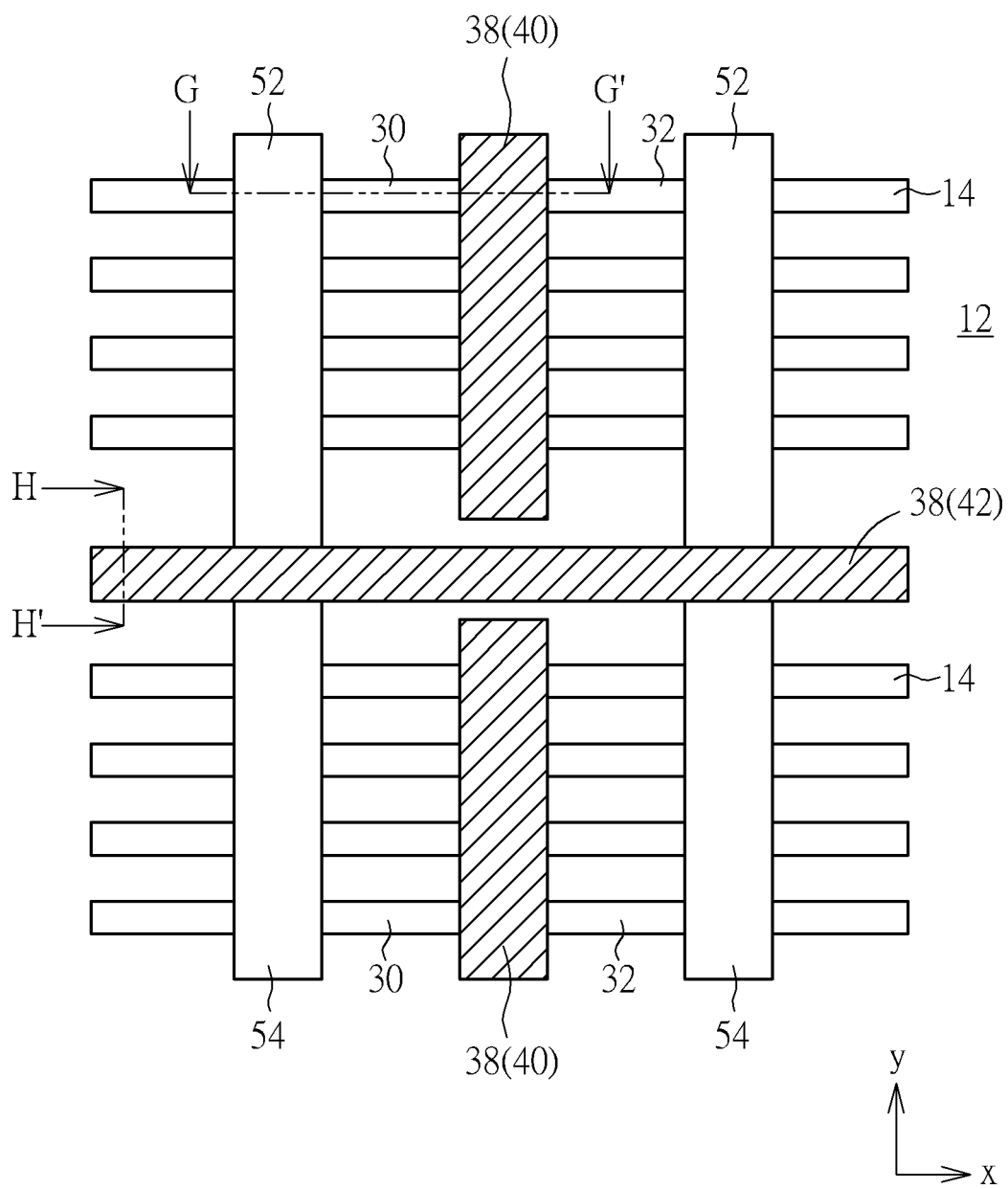
FIG. 9 is a top view illustrating a method for fabricating a semiconductor device according to an embodiment of the present invention following FIG. 6.
Figure 10:
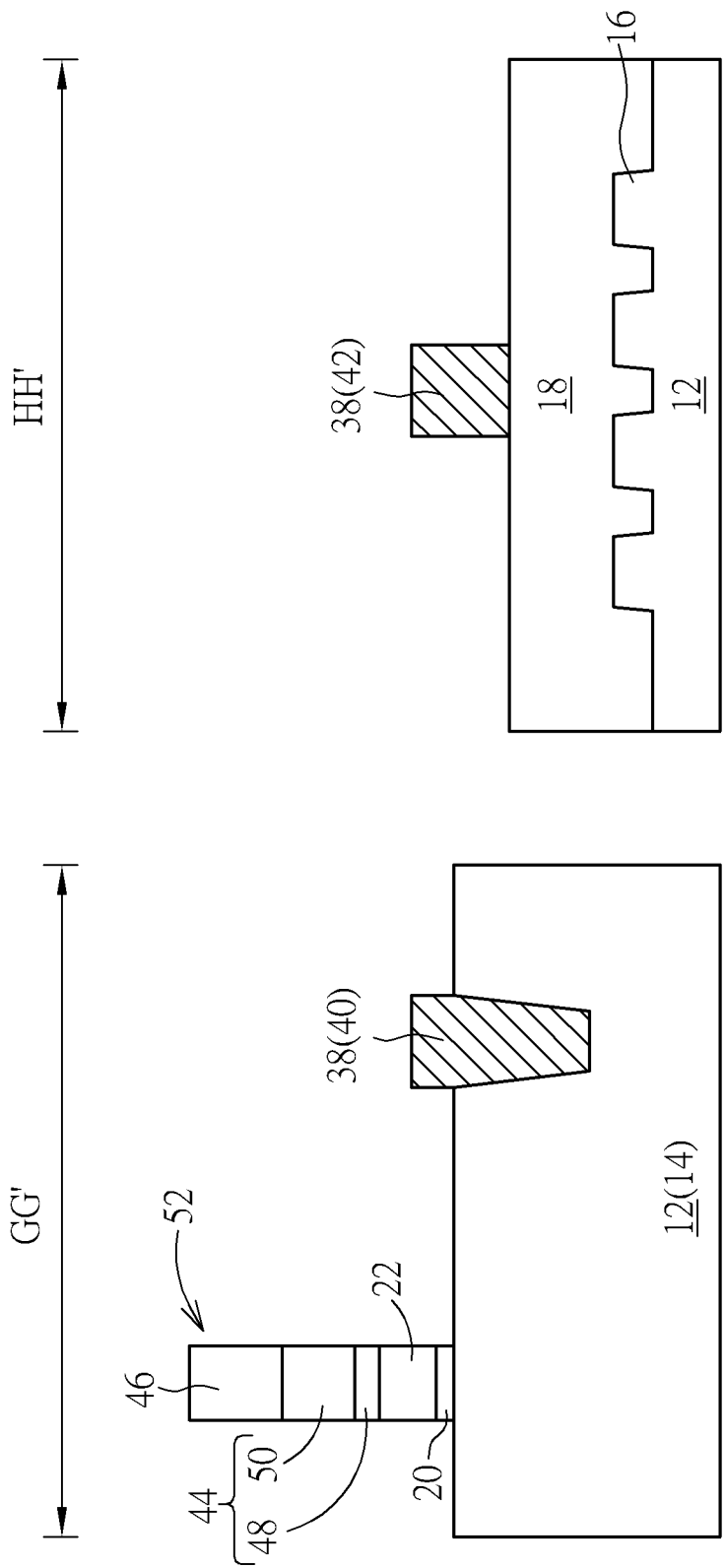
FIG. 10 illustrates cross-section views of FIG. 9 along the sectional line GG' and sectional line HH'.

Referring to FIGS. 9-10, in which FIG. 9 is a top view illustrating a method for fabricating a semiconductor device according to an embodiment of the present invention following FIG. 6, the left portion of FIG. 10 illustrates a cross-sectional view of FIG. 9 for fabricating the semiconductor device along the sectional line GG', and the right portion of FIG. 10 illustrates a cross-sectional view of FIG. 9 for fabricating the semiconductor device along the sectional line HH'. As shown in FIGS. 9-10, the patterned mask 46 is then used as mask to remove part of the hard mask 44, part of the gate layer 22, and part of the gate dielectric layer 20 to form a plurality of gate electrode or gate structures 52, 54 extending along the second direction (or Y-direction) and standing astride on the fin-shaped structures 14, in which the patterned hard mask 44 is disposed on each of the gate electrode or gate structures 52, 54. It should be noted that since a gate isolation structures 42 has already been formed between the top four fin-shaped structures 14 and the bottom four fin-shaped structures 14 before the patterned mask 46 is formed, four separate gate structures 52, 54 not contacting each other are automatically formed when the patterned mask 46 is used as mask to remove part of the hard mask 44 and part of the gate layer 22 for defining the pattern of the gate structures 52, 54.

It should further be noted that when the patterned mask 46 is used as mask to remove part of the hard mask 44 and part of the gate layer 22 to form gate structures 52, 54, part of the SDB structures 40 and/or gate isolation structure 42 could also be removed to obtain lower heights. For instance, as shown in FIG. 10, the tip or topmost surfaces of the SDB structure 40 and the gate isolation structure 42 are preferably lower than the topmost surface of the gate structures 52, 54 or gate electrodes including the gate dielectric layer 20 and the gate layer 22, in which the SDB structure 40 preferably protrudes above the fin-shaped structure 14 surface, the gate isolation structure 42 is disposed on the STI 18, and the top surfaces of the SDB structure 40 and the gate isolation structure 42 are coplanar.

Figure 11:
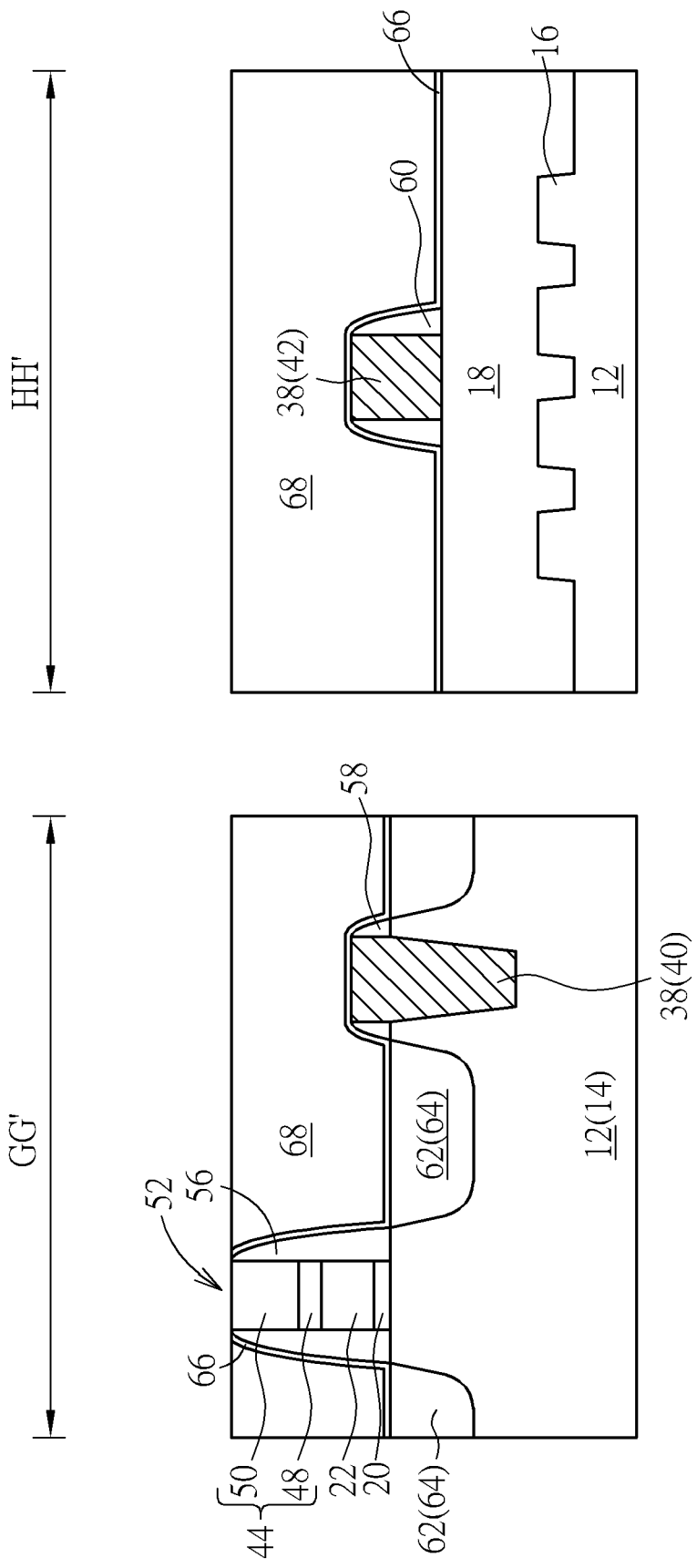
FIG. 11 illustrates a method for fabricating a semiconductor device according to an embodiment of the present invention following FIG. 10.

Next, as shown in FIG. 11, a cap layer could be formed on the fin-shaped structures 14 to cover the gate structures 52, 54, the SDB structure 40, and the gate isolation structure 42, and an etching process is conducted to remove part of the cap layer for forming at least a spacer 56 adjacent to the sidewalls of the gate structure 42 and at the same time forming a spacer 58 on the sidewalls of the SDB structure 40 and a spacer 60 on sidewalls of the gate isolation structure 42. Next, source/drain regions 62 and/or epitaxial layers 64 are formed in the fin-shaped structures 14 adjacent to two sides of the spacers 56, 58, and silicides (not shown) could be selectively formed on the surface of the source/drain regions 60 and/or epitaxial layers 64 afterwards. In this embodiment, each of the spacers 56, 58, 60 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 62 could include dopants of different conductive type depending on the type of device being fabricated.

Next, a contact etch stop layer (CESL) 66 is formed on the surface of the fin-shaped structures 14 and covering the gate structure 52, 54, the SDB structure 40, and the gate isolation structure 42, and an interlayer dielectric (ILD) layer 68 is formed on the CESL 66. Next, a planarizing process such as CMP is conducted to remove part of the ILD layer 68 and part of the CESL 66 for exposing the hard mask 44 so that the top surfaces of the hard mask 44 and the ILD layer 68 are coplanar.

Figure 12:
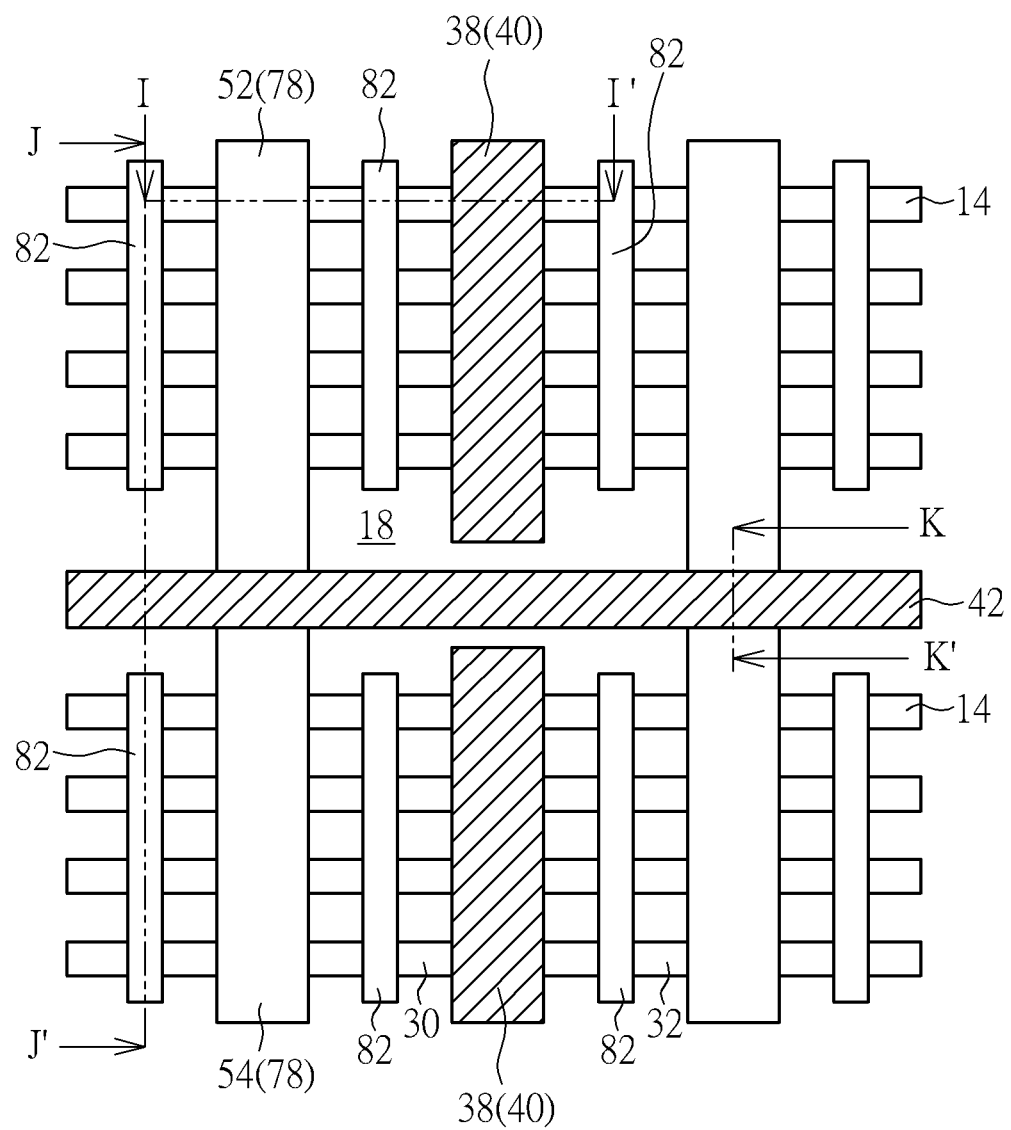
FIG. 12 is a top view illustrating a method for fabricating a semiconductor device according to an embodiment of the present invention following FIG. 9.
Figure 13:
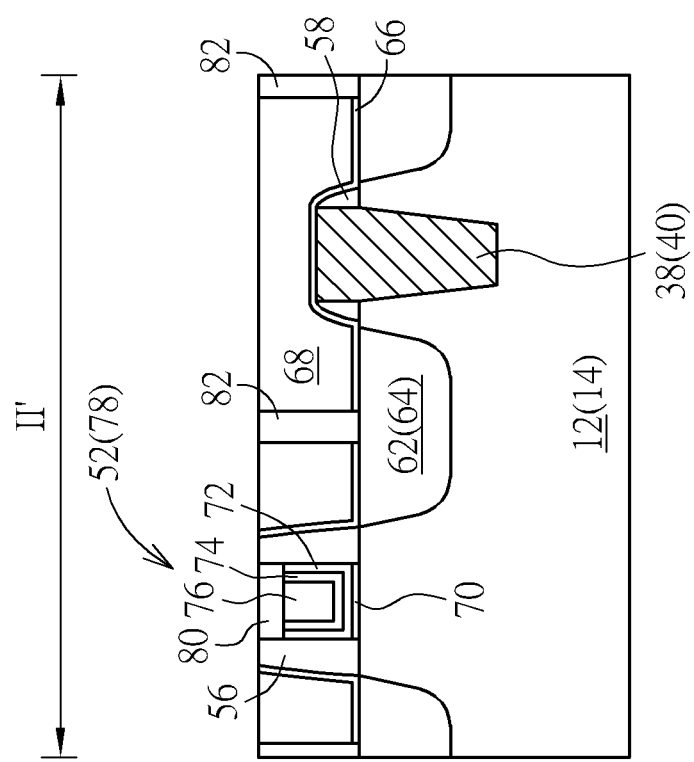
FIG. 13 illustrates a cross-section view of FIG. 12 along the sectional line II'.
Figure 14:
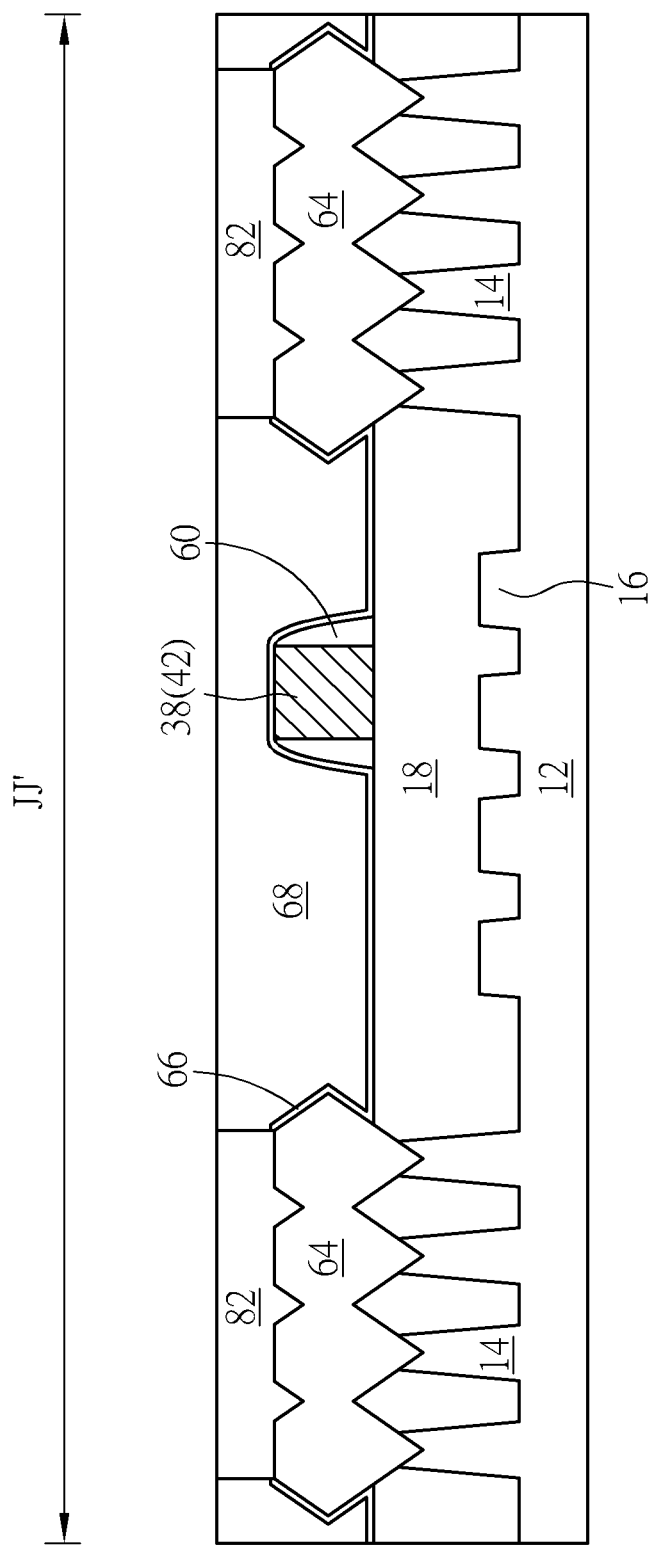
FIG. 14 illustrates a cross-section view of FIG. 12 along the sectional line JJ'.
Figure 15:
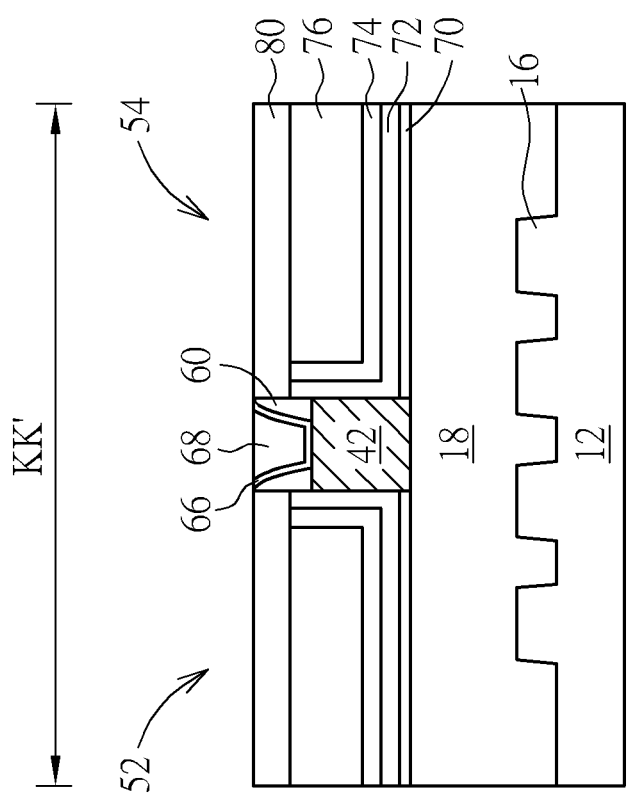
FIG. 15 illustrates a cross-section view of FIG. 12 along the sectional line KK'.

Referring to FIGS. 12-15, in which FIG. 12 is a top view illustrating a method for fabricating a semiconductor device according to an embodiment of the present invention following FIG. 9, FIG. 13 illustrates a cross-sectional view of FIG. 12 for fabricating the semiconductor device along the sectional line II', FIG. 14 illustrates a cross-sectional view of FIG. 12 for fabricating the semiconductor device along the sectional line JJ', and FIG. 15 illustrates a cross-sectional view of FIG. 12 for fabricating the semiconductor device along the sectional line KK'. As shown in FIGS. 12-15, a replacement metal gate (RMG) process is conducted to transform the gate structure 52, 54 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the second hard mask 44, the gate layer 22, and even gate dielectric layer 20 from gate structures 52, 54 for forming recesses (not shown) in the ILD layer 68.

Next, a selective interfacial layer 70 or gate dielectric layer (not shown), a high-k dielectric layer 72, a work function metal layer 74, and a low resistance metal layer 76 are formed in the recess, and a planarizing process such as CMP is conducted to remove part of low resistance metal layer 76, part of work function metal layer 74, and part of high-k dielectric layer 72 to form metal gates 78. Next, part of the low resistance metal layer 76, part of the work function metal layer 74, and part of the high-k dielectric layer 72 are removed to form another recess (not shown), and a hard mask 80 made of dielectric material including but not limited to for example silicon nitride is deposited into the recess so that the top surfaces of the hard mask 80 and ILD layer 68 are coplanar. In this embodiment, the gate structure or metal gate 78 fabricated through high-k last process of a gate last process preferably includes an interfacial layer 70 or gate dielectric layer (not shown), a U-shaped high-k dielectric layer 72, a U-shaped work function metal layer 74, and a low resistance metal layer 76.

In this embodiment, the high-k dielectric layer 72 is preferably selected from dielectric materials having dielectric constant (k value) larger than 4. For instance, the high-k dielectric layer 72 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 74 is formed for tuning the work function of the metal gate in accordance with the conductivity of the device. For an NMOS transistor, the work function metal layer 74 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 74 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 74 and the low resistance metal layer 76, in which the material of the barrier layer may include titanium (Ti), titanium nitride (TiN), tantalum (Ta) or tantalum nitride (TaN). Furthermore, the material of the low-resistance metal layer 76 may include copper (Cu), aluminum (Al), titanium aluminum (TiAl), cobalt tungsten phosphide (CoWP) or any combination thereof.

Next, a pattern transfer process is conducted by using a patterned mask (not shown) as mask to remove part of the ILD layer 68 and part of the CESL 66 adjacent to the metal gates 78 and SDB structure 40 for forming contact holes (not shown) exposing the source/drain regions 62 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 82 electrically connecting the source/drain regions 62. This completes the fabrication of a semiconductor device according to a preferred embodiment of the present invention.

It should be noted that even though the aforementioned embodiment first forms the first trench 28 for fabricating the SDB structure 40 in FIG. 3 and then forms the second trench 36 for fabricating the gate isolation structure 42, according to an embodiment of the present invention, it would also be desirable to reverse the order for forming the first trench 28 and second trench 36 by first forming the second trench 36 used for fabricating the gate isolation structure 42 in the STI 18 according to the process shown in FIG. 5 and then forming the first trench 28 used for fabricating the SDB structure 40 according to the process shown in FIG. 3, depositing a dielectric material into the first trench 28 and the second trench 36 at the same time, and conducting a planarizing process to remove part of the dielectric material for forming the SDB structure 40 and gate isolation structure 42, which is also within the scope of the present invention.

Moreover, even though the hard mask 44 made of hard masks 48, 50 are formed on the surface of the gate layer 22 after the SDB structure 40 and gate isolation structure 42 are formed as shown in FIG. 8, according to an embodiment of the present invention, it would also be desirable to form at least a hard mask such as a hard mask 48 made of silicon nitride on the surface of the gate layer 22 before forming the patterned mask 24 as shown in FIG. 2, and then forming the patterned mask 24 on the surface of the hard mask before continue with the follow-up process. For instance, the patterned mask 24 could then be used as mask to remove part of the hard mask, part of the gate layer 22, part of the gate dielectric layer 20, and part of the fin-shaped structures 14 to form the first trench 28 used for preparing the SDB structure 40, which is also within the scope of the present invention.

Referring to FIG. 14, FIG. 14 illustrates a structural view of a semiconductor device according to an embodiment of the present invention. As shown in FIG. 14, the semiconductor device preferably includes a gate isolation structure 42 disposed on the STI 18, a spacer 60 around the gate isolation structure 42, epitaxial layer 64 disposed on one side of the gate isolation structure 42, another epitaxial layer 64 disposed on another side of the gate isolation structure 42, a plurality of fin-shaped structures 14 disposed under the epitaxial layers 64, a CESL 66 disposed on the surface of the gate isolation structure 42, the STI 18, and part of the epitaxial layers 64, an ILD layer 68 disposed on the CESL 66, and contact plugs 82 disposed adjacent to two sides of the gate isolation structure 42 and on the epitaxial layers 64.

Preferably, the gate isolation structure 42 and the STI 18 could be made of same material or different materials, in which the gate isolation structure 42 could include but not limited to for example SiO$_2$, SiN, or SiON. Moreover, even though the top or topmost surface of the gate isolation structure 42 is even with the top or topmost surface of the adjacent epitaxial layers 64, according to other embodiments of the present invention, the topmost surface of the gate isolation structure 42 could also be slightly higher than or slightly lower than the topmost surface of the epitaxial layers 64 on the two sides, which is also within the scope of the present invention.

Referring to FIG. 15, FIG. 15 illustrates a structural view of a semiconductor device according to an embodiment of the present invention. As shown in FIG. 15, the semiconductor device preferably includes a gate structure 52 and gate structure 54 disposed on the STI 18, a hard mask 80 disposed on each of the gate structures 52, 54, a gate isolation structures 42 disposed between the two gate structures 52, 54, spacers 60 disposed adjacent to the gate structures 52, 54 and directly on the gate isolation structure 42, a CESL 66 disposed on the gate isolation structure 42 and between the two spacers 60, and an ILD layer 68 disposed on the CESL 66, in which the top surfaces of the ILD layer 68 and the hard mask 80 are coplanar.

Viewing from a more details perspective, the top or topmost surface of the gate isolation structure 42 is preferably lower than the topmost surface of the gate structures 52, 54 or gate electrodes adjacent to two sides of the gate isolation structure 42, the sidewalls of the gate isolation structure 42 are aligned with sidewalls of the hard masks 80, the gate structures 52, 54 contact the gate isolation structure 42 directly, the spacers 60 are disposed on sidewalls of the hard mask 80 and gate structures 52, 54 while the bottom or bottommost surface of the spacers 60 are slightly higher than the bottommost surface of the gate structures 52, 54 but slightly lower than the topmost surface of the gate structures 52, 54, the bottom surface of the spacers 60 contact the gate isolation structure 42 directly, the CESL 66 contacts the spacers 60 and the gate isolation structure 42 directly, the CESL 66 preferably includes a U-shaped cross-section, and the top surfaces of the ILD layer 68, the CESL 66, and the hard mask 80 are coplanar.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a gate isolation structure on a shallow trench isolation (STI);
   a first epitaxial layer on one side of the gate isolation structure, wherein a top surface of the gate isolation structure is even with a top surface of the first epitaxial layer; and
   a second epitaxial layer on another side of the gate isolation structure.

* * * * *